(12) United States Patent
Iwasaki et al.

(10) Patent No.: US 7,336,254 B2
(45) Date of Patent: Feb. 26, 2008

(54) SHIFT REGISTER THAT SUPPRESSES OPERATION FAILURE DUE TO TRANSISTOR THRESHOLD VARIATIONS, AND LIQUID CRYSTAL DRIVING CIRCUIT INCLUDING THE SHIFT REGISTER

(75) Inventors: Chisato Iwasaki, Miyagi-ken (JP); Tatsumi Fujiyoshi, Miyagi-ken (JP); Yukimitsu Yamada, Miyagi-ken (JP); Koji Kikuchi, Miyagi-ken (JP)

(73) Assignee: ALPS Electric Co., Ltd., Ota-ku, Tokyo (JP)

( * ) Notice: Subject to any disclaimer, the term of this patent is extended or adjusted under 35 U.S.C. 154(b) by 526 days.

(21) Appl. No.: 11/076,823

(22) Filed: Mar. 9, 2005

(65) Prior Publication Data
US 2005/0212746 A1  Sep. 29, 2005

(30) Foreign Application Priority Data
Mar. 29, 2004  (JP) ............................. 2004-093908

(51) Int. Cl.
*G09G 3/36*  (2006.01)

(52) U.S. Cl. ..................................... 345/100; 345/204

(58) Field of Classification Search .......... 345/88–100, 345/204
See application file for complete search history.

(56) References Cited

U.S. PATENT DOCUMENTS 3,573,490 A * 4/1971 Sevin et al. .................. 377/79
5,434,899 A   7/1995 Huq et al.

* cited by examiner

*Primary Examiner*—Richard Hjerpe
*Assistant Examiner*—Jean Lesperance
(74) *Attorney, Agent, or Firm*—Beyer Weaver LLP

(57) ABSTRACT

A shift register having a plurality of stages connected in cascade shifts an output signal by a plurality of clocks having different phases. Each of the stage includes an input diode to which a signal is input from a preceding stage, a capacitor for holding charge having a voltage level of the input signal, a first transistor that is turned on or off by the held voltage level to output an output signal to a following stage in synchronization with a clock signal, and a second transistor connected between the input diode and an output terminal. A control electrode of the second transistor is connected to the input diode in the following stage. The second transistor has a clamping function for discharging the accumulated charge and turning off the first transistor when the clock signal is phase-shifted.

11 Claims, 9 Drawing Sheets

SHIFT REGISTER THAT SUPPRESSES OPERATION FAILURE DUE TO TRANSISTOR THRESHOLD VARIATIONS, AND LIQUID CRYSTAL DRIVING CIRCUIT INCLUDING THE SHIFT REGISTER

BACKGROUND OF THE INVENTION

1. Field of the Invention

The present invention relates to a shift register and to a liquid crystal driving circuit including the same. More specifically, the present invention relates to a shift register used in a liquid crystal display for supplying scanning drive signals, and to a liquid crystal driving circuit including the shift register.

2. Description of the Related Art

Active-matrix liquid crystal displays (LCDs) used in, for example, computers and televisions include an array of video signal lines (source lines) and scanning drive signal lines (gate lines), and switching devices, such as thin-film transistors (TFTs), disposed at intersections of the video signal lines and the scanning drive signal lines for driving liquid crystal of pixels.

Scanning drive signals are supplied to the scanning drive signal lines to sequentially scan the signal lines so that all switching devices on a given scanning drive signal line are temporarily rendered into a conducting state (or an on state). In synchronization with the scanning drive signal lines, video signals are supplied to the video signal lines.

A shift register sequentially supplies the scanning drive signals to the scanning drive signal lines.

FIG. 8 is a circuit diagram of a shift register of the related art. Although the shift register includes multiple stages, three of them, e.g., stages i−1, i, and i+1, are shown in FIG. 8. FIG. 9 is a timing chart of the shift register shown in FIG. 8.

As shown in FIG. 8, each of the stages i−1, i, and i+1 is composed of four transistors and one capacitor. This structure does not place excessive stress on the transistors, and reduces deterioration of transistor characteristics.

For example, focusing on the stage i, a diode-connected input transistor 51 is connected to an output node Gi−1 of the preceding stage i−1, and an output electrode of the input transistor 51 is connected to a control electrode of an output transistor 52 and a clamping transistor 53. An output electrode of the output transistor 52 is connected to a pull-down transistor 54. A capacitor 55 is connected between the control electrode and output electrode of the output transistor 52.

In this shift register, as shown in FIG. 8, a plurality of phase-shifted clock signals CKA, CKB, and CKC are input to the output transistors 52 of the stages i−1, i, i+1, and a control electrode of the clamping transistor 53 in a given stage is supplied with an output signal from the stage two stages after this stage.

In the stage i shown in FIG. 8, as shown in FIG. 9, when an output signal Gi−1 of the preceding stage i−1 is at a high level, the input transistor 51 is turned on, and an electric potential Vbi (control signal) of the control electrode of the output transistor 52 goes high. In this state, the output transistor 52 is turned on.

When the clock signal CKB input to the output transistor 52 is switched high, an output signal Gi of the stage i is switched high, and is then output.

When an output signal Gi+2 of the stage two stages after the stage i is switched high and is input to the control electrode of the clamping transistor 53 in the stage i, the clamping transistor 53 is turned on, and the electric potential Vbi of the control electrode of the output transistor 52 goes low. In this way, the output signals Gi−1, Gi, Gi+1 are sequentially output from the stages i−1, i, and i+1, respectively. This structure is useful for, for example, a scanning circuit in a liquid crystal display (see Japanese Unexamined Patent Application Publication No. 08-87897).

However, in the shift register disclosed in this publication, as shown in FIG. 9, the node indicated by the electric potential Vbi shown in FIG. 8 holds a voltage as high as or higher than the high-level voltage for a period of time three times longer than the pulse width of the clock signal, and supplies the high voltage to the control electrode (gate electrode) of the transistor 52.

In the shift register shown in FIG. 8, for example, an output pulse Gi+2 of the (i+2)-th stage is applied to the control electrode of the clamping transistor 53 in the stage i.

In this circuit operation, a voltage is still applied to the control electrode of the output transistor 52 after the output signal Gi is output from the stage i, and the output transistor 52 is maintained in the on state. When the clock signal CKB is switched low, the charge on the output line is discharged through the output transistor 52.

The pull-down transistor 54 is a non-switching transistor that is continuously conducting, and functions as a pull-down resistor whose output is maintained at the low level. The transistor 54 is not used to discharge a high-level output signal.

This circuit design overcomes a problem with traditional shift registers in that operation failure is caused by excessive stress placed on the pull-down transistor 54 when an inverting amplifier in an intermediate section of the shift registers is formed of the output transistor 52 and the pull-down transistor 54 of which the control electrode is connected to a constant voltage.

There are two solutions to this problem.

A first solution is that, as disclosed in the publication noted above, a voltage as high as a threshold voltage of the pull-down transistor 54, instead of a high-level signal (power supply voltage), is applied to the control electrode of the pull-down transistor 54 to reduce the stress on the pull-down transistor 54.

That is, a voltage that is slightly higher than the threshold voltage is applied to the control electrode of the pull-down transistor 54.

As described above, it is not desirable to increase the control voltage of the pull-down transistor 54. In order to ensure that the charge in the output terminal is discharged through the output transistor 52, an output signal of the (n+2)-th stage is applied to the control electrode of the clamping transistor 53 in the stage i to turn on the clamping transistor 53 while turning off the output transistor 52.

Alternatively, the clamping transistor 53 in the stage i may be turned on using an output signal of the stage i+1. Also in this case, as in the publication noted above, when the clock signal changes from high to low, the charge in the output terminal is discharged to the clock terminal through the output transistor 52. Thus, a demand exists for a circuit design for keeping the output transistor 52 in the on state for a while after the clock signal changes from high to low.

However, the voltage of the control electrode of the output transistor 52 and the voltage of the output terminal do not adjust each other. Due to the circuit design with limited flexibility, for example, characteristic deterioration of the output transistor 52 can cause unstable circuit operation.

A second solution is that a pulsed voltage signal is applied to the control electrode of the pull-down transistor 54 so as to activate the pull-down transistor 54 only when the output signal is reset (i.e., the output signal changes from high to low). The pull-down transistor 54 can be used to discharge the output signal.

That is, the charge is discharged not when the output terminal is reset, i.e., when the clock terminal is switched low, but when a resetting transistor is turned on.

Therefore, an additional circuit for applying a voltage to the control electrode of the pull-down transistor 54 for a short time is provided. This can cause problems of a complex circuit structure for applying a clock signal to a control electrode of an intermediate transistor and excessive stress placed on other transistors.

In particular, it is undesirable to apply repetitive voltages, e.g., clock signals, to the control electrode, as below.

As is well known in the art, D.C. voltages or clock signals continuously applied to a control electrode of a transistor cause changes of a threshold voltage, which is a voltage boundary between which the transistor is turned on and off, and a circuit including this transistor does not correctly operate.

The publication noted above takes measures against excessive stress on the pull-down transistor 54. However, an unnecessary voltage is still applied to the control electrode of the output transistor 52, thus preventing the shift register from shifting an output signal when the transistor 52 shown in FIG. 8 is not turned on by a predetermined threshold voltage due to threshold voltage variations.

For example, a shift register used in a scanning circuit of a liquid crystal display cannot shift output signals for sequentially driving scanning drive signal lines, resulting in no display on the screen.

SUMMARY OF THE INVENTION

Accordingly, it is an object of the present invention to provide a shift register that reduces stress on transistors and that suppresses transistor threshold variations to reduce operation failure due to threshold variations, and a liquid crystal driving circuit including the shift register, which does not cause display failure.

In one aspect of the present invention, a shift register having a plurality of stages connected in cascade shifts an output signal by a plurality of clock signals having different phases. Each stage includes an input diode to which a signal is input from a preceding stage, a capacitor for holding charge having a voltage level of the signal input from the input diode, a first transistor that is turned on or off by the voltage level held in the capacitor to output an output signal to a following stage in synchronization with a clock signal, and a second transistor connected between the input diode and an output terminal, a control electrode of the second transistor being connected to the input diode in the following stage. The second transistor operates as a clamping transistor for discharging the charge accumulated in the capacitor and turning off the first transistor when the clock signal is phase-shifted.

The shift register according to the present invention discharges (or resets) the charge accumulated in the capacitor that supplies a voltage to the control electrode of the first transistor in synchronization with a timing at which the clock signal changes from high to low (i.e., a rising time of the clock signal input to the following stage). This can greatly reduce a period of time for which unnecessary stress is placed on the first transistor, and can prevent threshold voltage variations (deterioration) of the first transistor.

Unlike a shift register of the related art, in which an output signal of an (n+1)-th or (n+2)-th stage is applied to the control electrode of the second transistor in an n-th stage, the shift register according to the present invention is configured such that the control electrode of the second transistor is connected to a node between the input diode and capacitor in the (n+1)-th stage. Thus, when the output signal changes from high to low, resetting operation is performed to prevent an unnecessary voltage from being applied to the control electrode.

In the shift register according to the present invention, each stage may further include a third transistor connected between the output terminal from which the output signal is output and a clock terminal to which the clock signal is input, and the third transistor may operate as a pull-down transistor for pulling down the voltage of the terminal when the clock signal is phase-shifted. When the clock signal is phase-shifted, the second transistor may discharge the charge accumulated in the capacitor to the clock terminal via the third transistor.

In the shift register according to the present invention, therefore, when the clock terminal is switched low, both terminals of the capacitor are short circuited by the second transistor, and both terminals of the capacitor are discharged at the same time via the third transistor to reset the application of a voltage to the control electrode of the first transistor, thereby reducing the voltage application time. Moreover, the capacitor is discharged by the clock terminal when the clock signal is at the low level, and no ground (GND) line is therefore required, thus reducing the size of the shift register.

The third transistor in a given stage may be forward connected between the output terminal and clock terminal in this stage with respect to the clock terminal.

In another aspect of the present invention, a shift register having a plurality of stages connected in cascade shifts an output signal by a plurality of clock signals having different phases. Each stage includes an input diode to which a signal is input from a preceding stage, a capacitor for holding charge having a voltage level of the signal input from the input diode, a first transistor that is turned on or off by the voltage level held in the capacitor to output an output signal to a following stage in synchronization with a clock signal, a second transistor connected between the input diode and a clock terminal to which the clock signal is input, and a third transistor connected in parallel to the second transistor between an output terminal from which the output signal is output and the clock terminal. The third transistor operates as a pull-down transistor for pulling down the voltage of the terminal to discharge the charge accumulated in the capacitor to the clock terminal when the clock signal is phase-shifted.

In the shift register according to the present invention, therefore, the second transistor and the third transistor are turned on when the clock terminal is switched low, and both terminals of the capacitor are connected to the clock terminal. Thus, both terminals of the capacitor are discharged by the clock terminal to reset the application of a voltage to the control electrode of the first transistor, thereby reducing the voltage application time. Moreover, the charge accumulated in the capacitor is discharged by the clock terminal when the clock signal is at the low level, and no ground (GND) line is therefore required, thus reducing the size of the shift register.

In the shift register according to the present invention, the control electrode of the second transistor may be connected to an output of the input diode in the following stage, and may discharge the charge accumulated in the capacitor when the clock is phase-shifted.

In the shift register according to the present invention, therefore, the second transistor and the third transistor are turned on when the clock terminal is switched low (i.e., when the voltage from the output terminal of the input diode in the following stage turns on the first transistor in the following stage), and both terminals of the capacitor are connected to the clock terminal. Thus, both terminals of the capacitor are discharged by the clock terminal to reset the application of a voltage to the control electrode of the first transistor, thereby reducing the voltage application time.

In the shift register according to the present invention, the input diode may be a transistor having a small area for a required current capacity. Thus, a compact diode that allows a predetermined current to easily flow can be formed.

The shift register may be configured such that a first shift register is divided into a plurality of blocks and is activated block-by-block by a second shift register. Thus, the first shift register that shifts the output signals can be selectively activated so as not to place stress on the transistor more than necessary to prevent characteristic changes while reducing the consumption power.

In another aspect of the present invention, a liquid crystal driving circuit is configured such that the shift register described above is used to generate a scanning drive signal for an active-matrix circuit having scanning lines and signal lines intersecting each other. Thus, operation failure due to characteristic changes of the transistor over time can be prevented, resulting in stable circuit operation.

In another aspect of the present invention, a liquid crystal driving circuit is configured such that the first shift register is made of the same material as that of thin-film transistors of an active-matrix circuit and the second shift register is made of a material different from that of the thin-film transistors. Therefore, the first shift register and the active-matrix circuit can be formed by the same manufacturing process without increasing the number of manufacturing steps. The second shift register can be a simple and small circuit, and can therefore be easily manufactured.

Therefore, the shift register according to the present invention can reduce the stress on the transistors, and can suppress transistor threshold variations to reduce the operation failure due to the threshold variations. Therefore, a liquid crystal driving circuit that does not cause display failure can be realized.

DESCRIPTION OF THE PREFERRED EMBODIMENTS

The present invention provides a shift register including a plurality of cascaded stages (or register stages), for shifting an output signal by a plurality of clock signals having different phases. Each stage includes an input diode (or a diode-connected transistor 1) to which an output signal is input from a preceding stage, a capacitor for holding charge having a voltage level of the output signal input from the input diode, an output transistor (or a transistor 2) that is turned on or off depending upon the voltage level held in the capacitor to output an output signal to a following stage in synchronization with a clock signal, and a clamping transistor (or a transistor 3) connected between the input diode and an output terminal, a control electrode of this transistor being connected to the input diode in the following stage. The clamping transistor discharges the charge accumulated in the capacitor and turns off the output transistor when the clock signal is phase-shifted.

A shift register according to embodiments of the present invention will now be described.

First Embodiment

Figure 1:
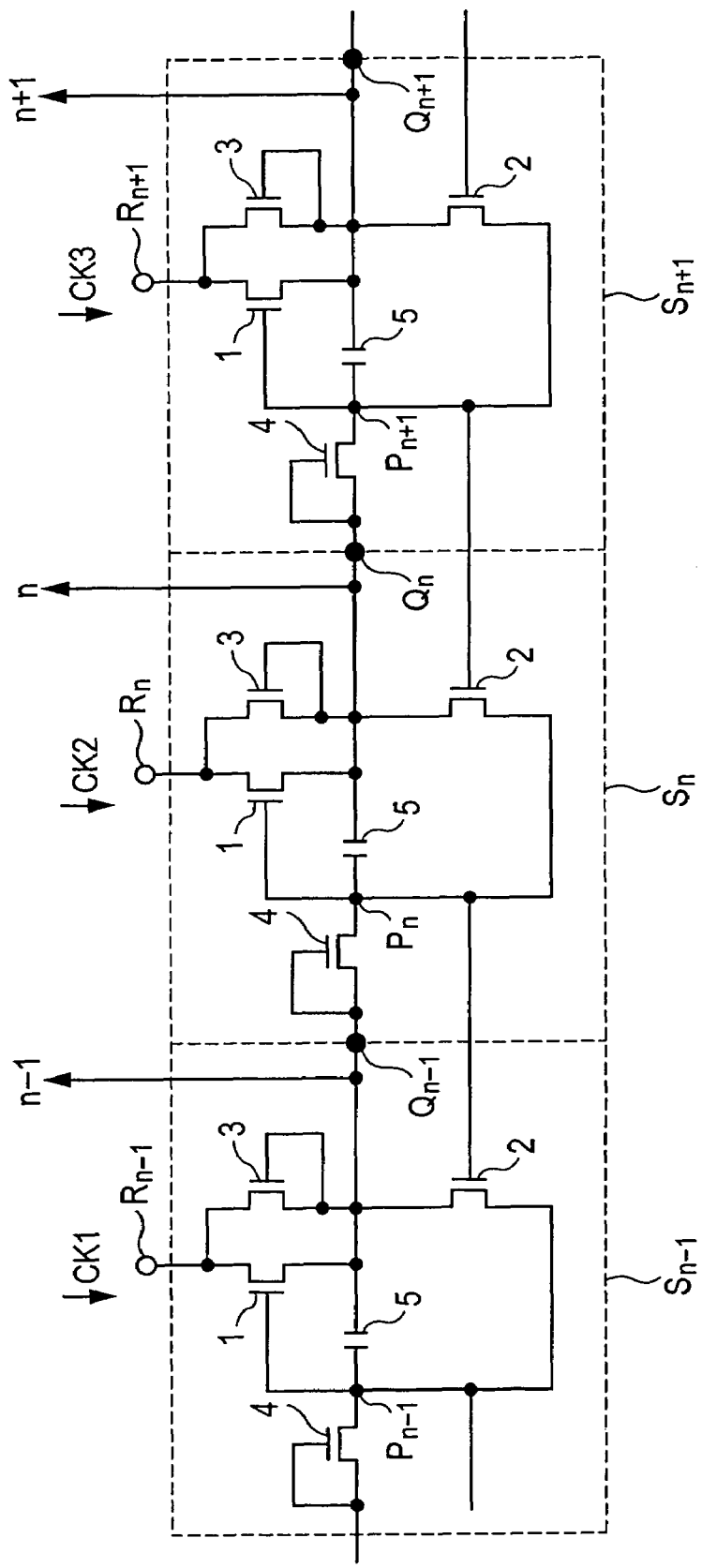
FIG. 1 is a circuit diagram of a shift register according to a first embodiment of the present invention.

FIG. 1 is a circuit diagram of a shift register according to a first embodiment of the present invention, showing three stages n−1, n, and n+1 of the shift register, by way of example.

These stages have a similar structure, and will be described in the context of the stage n. The stage n includes transistors 1, 2, 3, and 4 and a capacitor 5. The transistors 1, 2, 3, and 4 may be n-channel metal insulator semiconductor (MIS) transistors.

The transistor 4 is a diode-connected transistor between an input terminal Qn−1 (or an output terminal of an (n−1)-th stage Sn−1) and a first terminal of the capacitor 5 (or a node Pn). The diode formed of the transistor 4 is forward connected to the capacitor 5 from the input terminal Qn−1.

A source terminal of the transistor 4 is a connected to the first terminal of the capacitor 5, and a drain terminal and a control electrode of the transistor 4 are connected to the input terminal Qn−1.

The transistor 1 has a drain terminal connected to a clock terminal Rn, a control electrode connected to the node Pn, and a source terminal connected to a second terminal of the capacitor 5 (or an output terminal Qn). The output terminal Qn corresponds to an input terminal in an (n+1)-th stage Sn+1 that follows the stage n.

The transistor 2 has a drain terminal connected to the output terminal Qn, and a source terminal connected to the node Pn. A control electrode of the transistor 2 is connected to a node Pn+1 in the (n+1)-th stage Sn+1. At the node Pn+1 in the (n+1)-th stage Sn+1, the source terminal of the transistor 4 and the first terminal of the capacitor 5 are connected to each other.

The transistor 3 serves as a pull-down transistor connected in parallel to the transistor 1 between the clock terminal Rn and the output terminal Qn. A control electrode of the transistor 3 is connected to a source terminal of the transistor 3 or the output terminal Qn. The transistor 3 is forward diode-connected with respect to the clock terminal Rn.

The transistor 3 has a pull-down function for discharging the output terminal Qn for a low-level period of a clock CK2 input to the clock terminal Rn after outputting an output signal. The transistor 2 also discharges the output terminal Qn. In the theory of operation, therefore the transistor 3 may not be included in the circuit.

Figure 2:
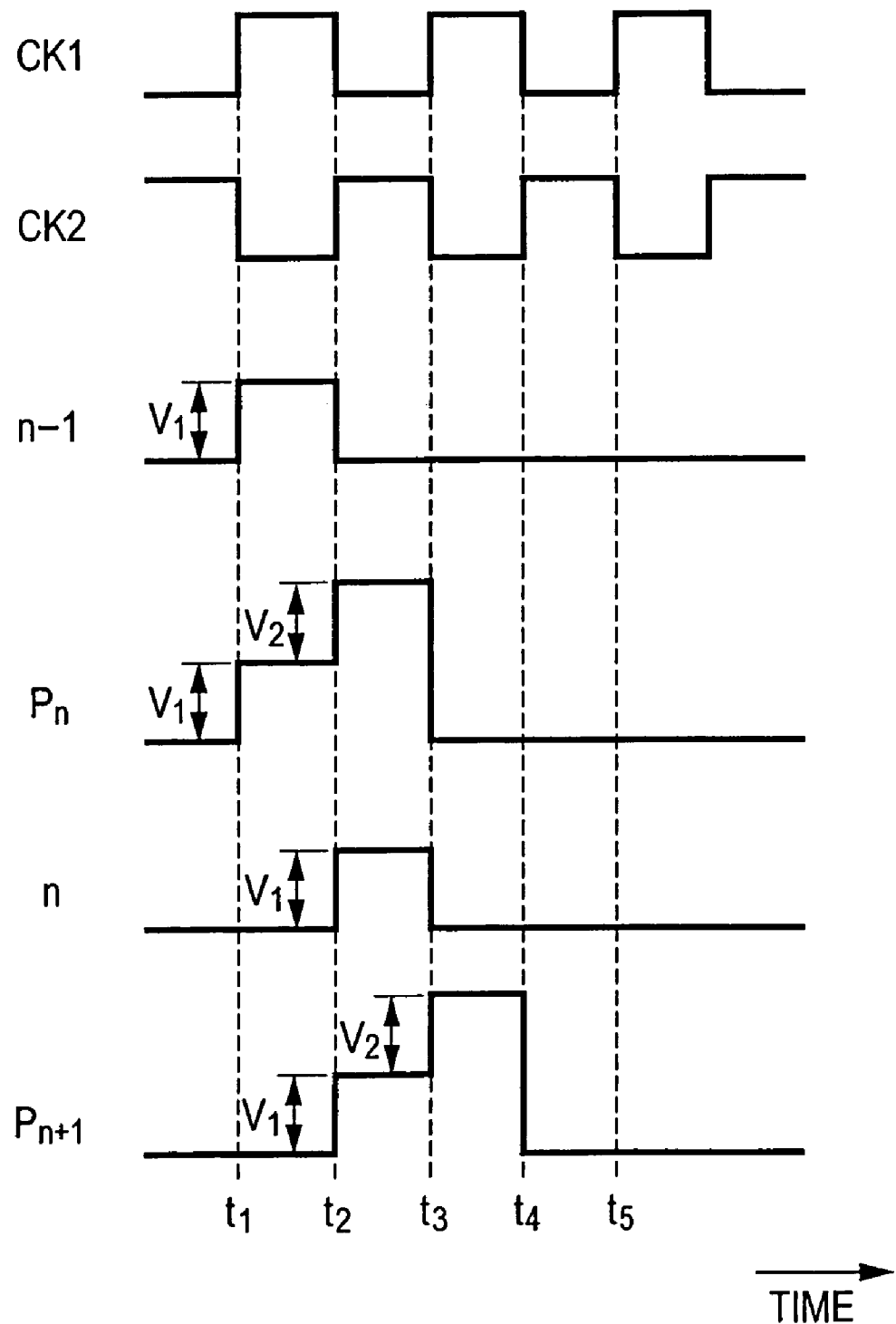
FIG. 2 is a timing chart showing the operation of the shift register according to the first embodiment.

FIG. 2 is a timing chart showing the operation of the shift register shown in FIG. 1 according to the first embodiment.

At time t1, when the clock signal CK1 changes from low to high (i.e., the clock signal CK1 is phase-shifted) and the clock CK2 changes from high to low, an output signal n−1 is output from the preceding (i.e., (n−1)-th) stage Sn−1 to the stage Sn. At this time, the transistor 2 is in the off state.

In the stage Sn, a current indicated by the output signal n−1 is input to the node Pn via the diode-connected transistor 4, and the capacitor 5 is charged. Thus, the electric potential at the node Pn increases to a predetermined voltage level to obtain a voltage V1.

When the electric potential of the node Pn becomes equal to or higher than a threshold voltage, the transistor 1 is turned on while the output terminal Qn is still at the low level because the clock signal CK2 is kept at the low level.

Although the control electrode of the transistor 2 in the (n−1)-th stage Sn−1 is at the high level, the output levels of the node Pn−1 and the output terminal Qn−1 are equal to or higher than the high-level voltage because the clock signal CK1 is at the high level.

At time t2, when the clock signal CK1 changes from high to low and the clock signal CK2 changes from low to high, a high-level voltage of the clock signal CK2 is supplied to the output terminal Qn via the transistor 1 from the clock terminal Rn. The electric potential at the first terminal (the terminal near the node Pn) of the capacitor 5 increases due to bootstrapping caused by an increase in the second terminal of the capacitor 5 to obtain a voltage V1+V2. The voltage V2 is substantially equal to the voltage V1 without parasitic capacitance.

Thus, the voltage at the control electrode of the transistor 1 is higher than the high-level voltage of the clock signal CK2. This prevents voltage drop due to the threshold voltage, and allows the voltage at the output terminal Qn to increase so as to become substantially equal to the high-level voltage of the clock signal CK2.

Then, the output signal n at the output terminal Qn changes from low to high. That is, high-level scanning drive signal pulses are output.

At this time, in the preceding stage Sn−1, the clock signal CK1 changes from high to low. Thus, the charge accumulated in the connection terminal Qn−1 (namely, the capacitor 5) is discharged from the clock terminal Rn−1 via the transistor 1 and the diode-connected transistor 3, and the output signal n−1 changes from high to low.

In the preceding stage Sn−1, the charge accumulated in the node Pn−1 (namely, the capacitor 5) is also discharged from the clock terminal Rn−1 via the transistors 2 and 3.

When the output signal n changes from low to high, in the following (i.e., (n+1)-th) stage Sn+1, a current that is responsive to the output signal n is input to the node Pn+1 via the diode-connected transistor 4, and the capacitor 5 is charged. Thus, the electric potential at the node Pn+1 increases to a predetermined voltage level to obtain a voltage V1.

In the stage Sn+1, the transistor 2 is turned on while the voltage level of the output signal n+1 output from the output terminal Qn+1 is kept at the low level because the clock signal CK1 is at the low level.

At time t3, the clock signal CK1 changes from low to high, and the clock signal CK2 changes from high to low.

In the stage Sn, the charge accumulated in the output terminal Qn (namely, the capacitor 5) is discharged to the clock terminal Rn via the transistor 1 and the diode-connected transistor 3, and the output signal n changes from high to low.

In the stage Sn, the transistor 2 is in the on state, thus causing the charge accumulated in the node Pn (namely, the capacitor 5) to be also discharged via the transistors 2 and 3. The voltage levels of the node Pn and the output terminal Qn become low (i.e., equal to or lower than the threshold voltage of the transistor 3).

Thus, the voltage level of the control electrode of the transistor 1 changes from high to low, and the transistor 1 is turned off.

An output signal n+1 output from the output terminal Qn+1 in the stage Sn+1 changes from low to high by a similar operation to that in the stage Sn at time t2. That is, high-level scanning drive signal pulses are output.

Therefore, in response to the phase-shifted clock signals CK1 and CK2 having same clock intervals in which the high level and the low level do not overlap (that is, 180-degree phase-shifted clock signals), high-level output signals are sequentially output from cascaded stages over time in the connected order in synchronization with the clock intervals to generate scanning drive signals for driving the scanning lines.

The clamping operation for preventing the transistor 1 from generating an output signal is performed when an output signal of a given stage is switched low (i.e., when a clock signal input from the clock terminal is switched low) because the control electrode of the clamping transistor 2 is connected to the output node of the transistor 4 in the following stage.

Therefore, a period of time for which a high-level voltage is applied to the control electrode of the transistor 1 is substantially equal to a total of the output signal pulse time of a given stage and the output signal pulse time of the following stage, which is about two times longer than the high-level time (or the pulse time) of an output signal.

Figure 9:
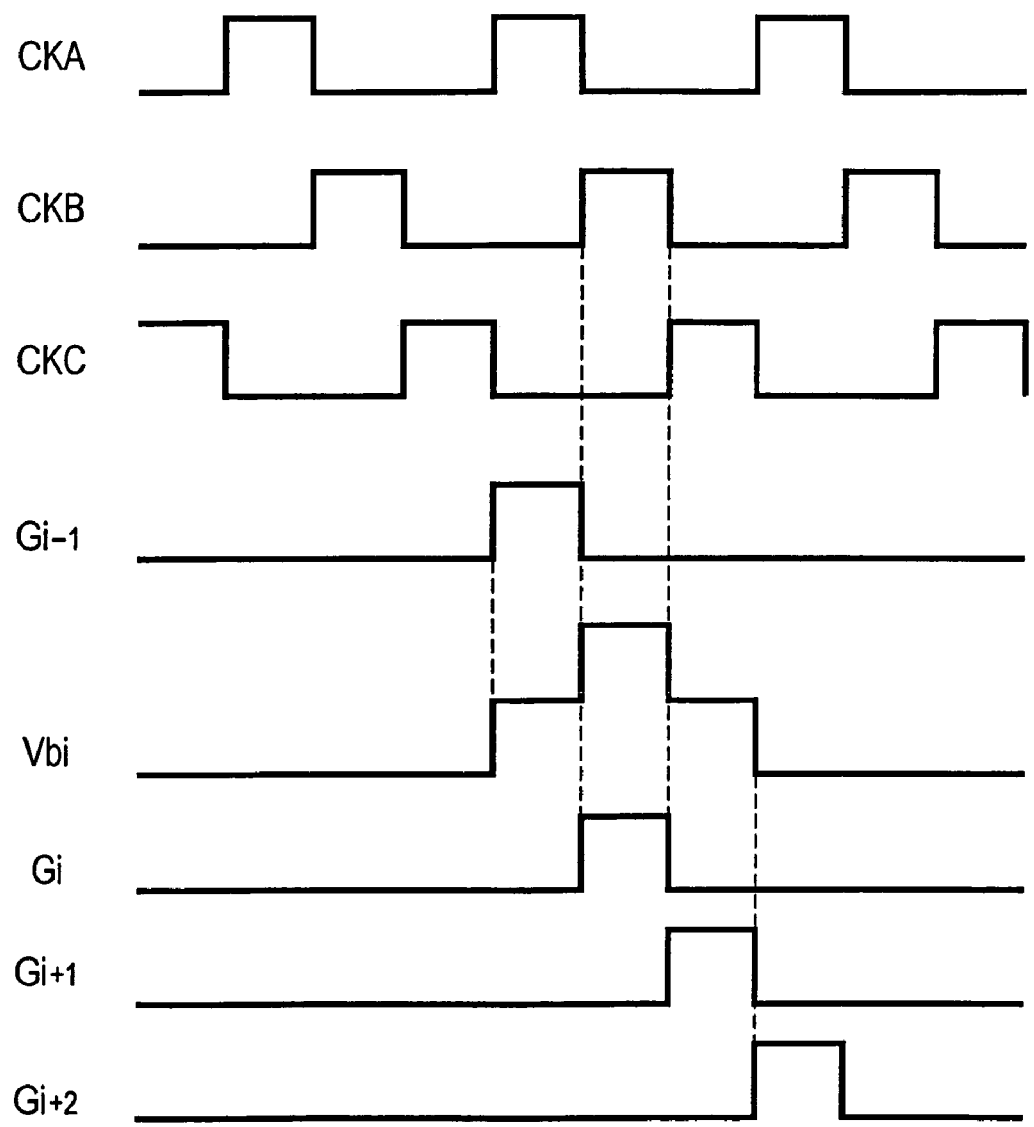
FIG. 9 is a timing chart showing the operation of the shift register shown in FIG. 8.

Accordingly, the period of time for which a high-level voltage is applied to the control electrode of the transistor 1 is two thirds of that in the related art (see FIG. 9), thus preventing deterioration of the transistor 1 over the related art.

The voltage applied to the control electrode of the clamping transistor 2 in a given stage corresponds to the voltage applied to the control electrode of the output transistor 1 in the following stage, and substantially the same stress are placed.

Similar overall changing waveform between the high level and the low level is obtained, and stress can uniformly be applied. Without using a transistor that can rapidly deteriorate, circuit operation failure over time due to deterioration of any transistor can be suppressed.

The capacitor 5 is a capacitor for holding a voltage to be applied to the control electrode of the transistor 1, and is also used for bootstrapping.

As described above, the voltage to be applied to the control electrode of the transistor 1 is bootstrapped to increase over the power supply voltage, which helps turn on the transistor 1. This also helps the clamping transistor 2 operate, which is useful for higher rate pulse operation.

The shift register may also be operated in response to external two-phase clock signals other than three-phase clock signals used in the related art.

The two-phase clock signals require a fewer signal lines, and a simpler clock circuit than that three-phase clock signals. Therefore, a smaller space is required for the circuit configuration.

Second Embodiment

Figure 3:
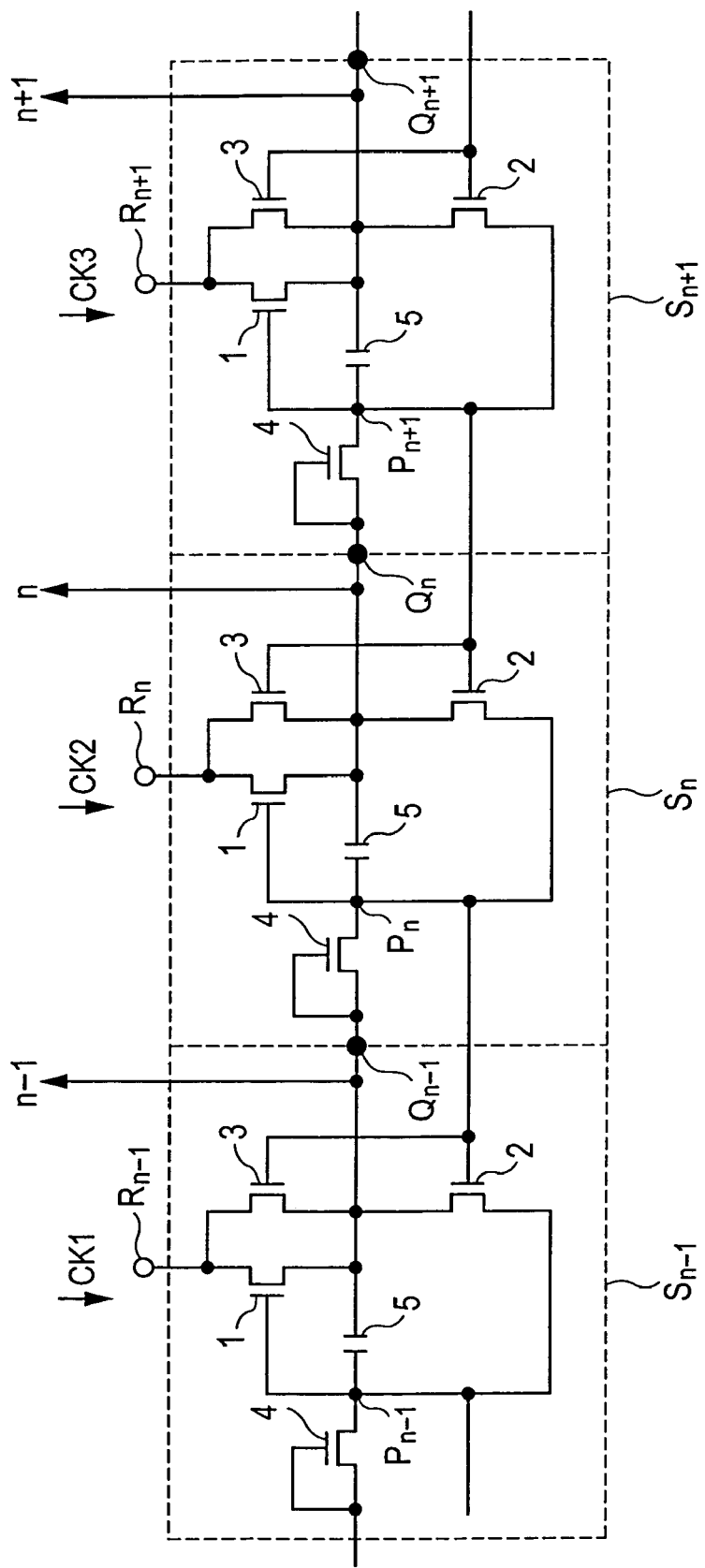
FIG. 3 is a circuit diagram of a shift register according to a second embodiment of the present invention.

FIG. 3 is a circuit diagram of a shift register according to a second embodiment of the present invention, showing three stages n−1, n, and n+1 of the shift register, by way of example.

The shift register according to the second embodiment is different from that according to the first embodiment in that the control electrode of the pull-down transistor 3 and the control electrode of the clamping transistor 2 in the stage Sn are connected to the output node of the transistor 4 in the following stage Sn+1. Similar components to those shown in FIG. 1 are assigned the same reference numerals, and a description thereof is omitted.

Figure 4:
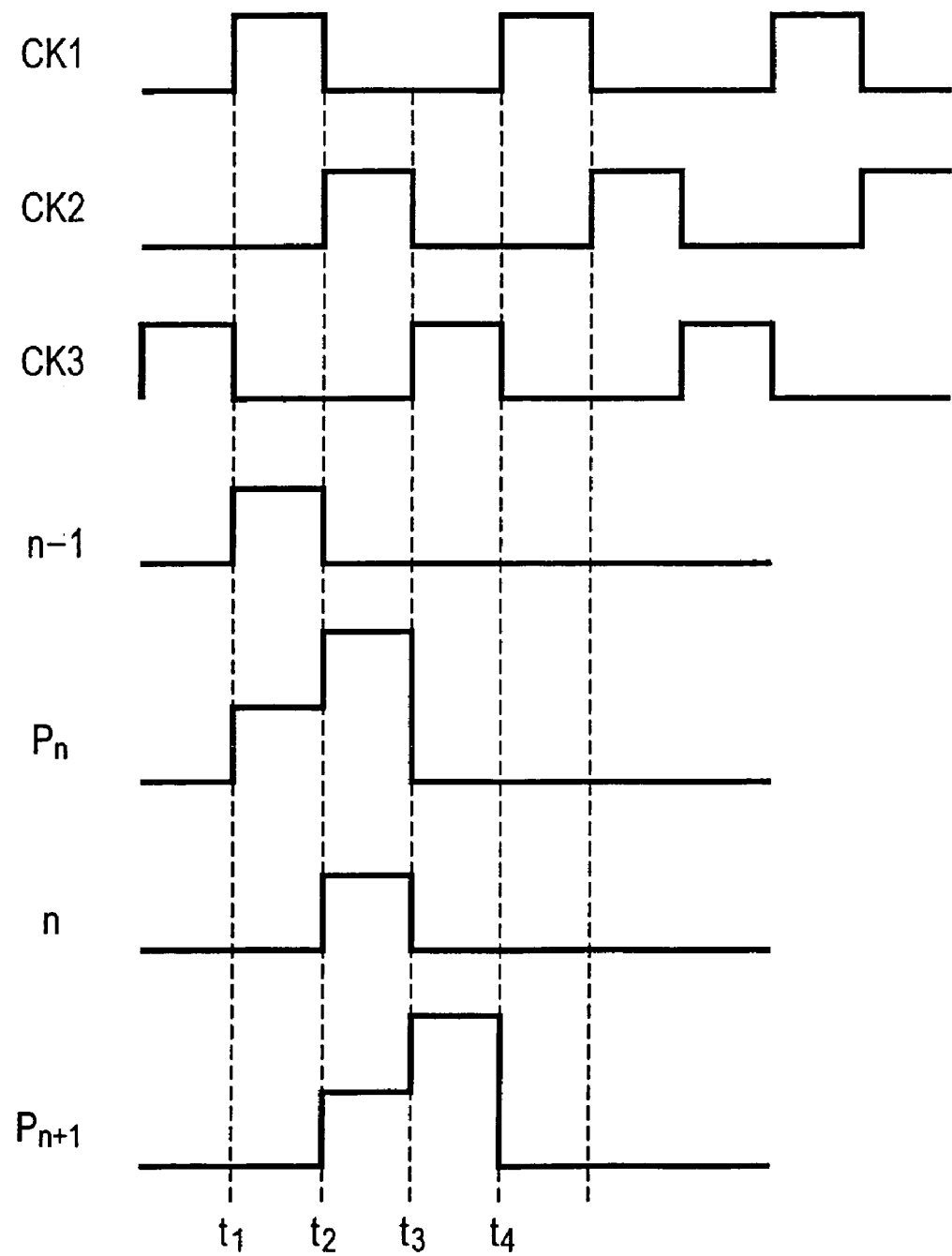
FIG. 4 is a timing chart showing the operation of the shift register according to the first embodiment (and also according to the second and third embodiments) using three-phase clock signals.

The shift register according to the second embodiment performs a similar operation to that of the shift register according to the first embodiment described with reference to the timing chart shown in FIG. 2, except that it is responsive to three-phase clock signals. FIG. 4 is a timing chart showing the operation of the shift register according to the second embodiment.

When the clock signals CK1, CK2, and CK3 are phase-shifted, the capacitor 5 in a given stage is discharged. When the capacitor 5 in the following stage is charged, a high-level output signal is output.

The transistors 2 and 3 are turned on when the electric potential of the connection terminal in the following stage is switched high, and are turned off when switched low.

Therefore, in addition to the advantages of the first embodiment, in the second embodiment, a voltage increased by bootstrapping is applied not only to the control electrode of the transistor 2 but also to the control electrode of the transistor 3, and the pull-down operation is not restricted by the transistor threshold voltage. Thus, the voltage of the output terminal can be reduced to the low-level voltage of the clock signal.

Third Embodiment

Figure 5:
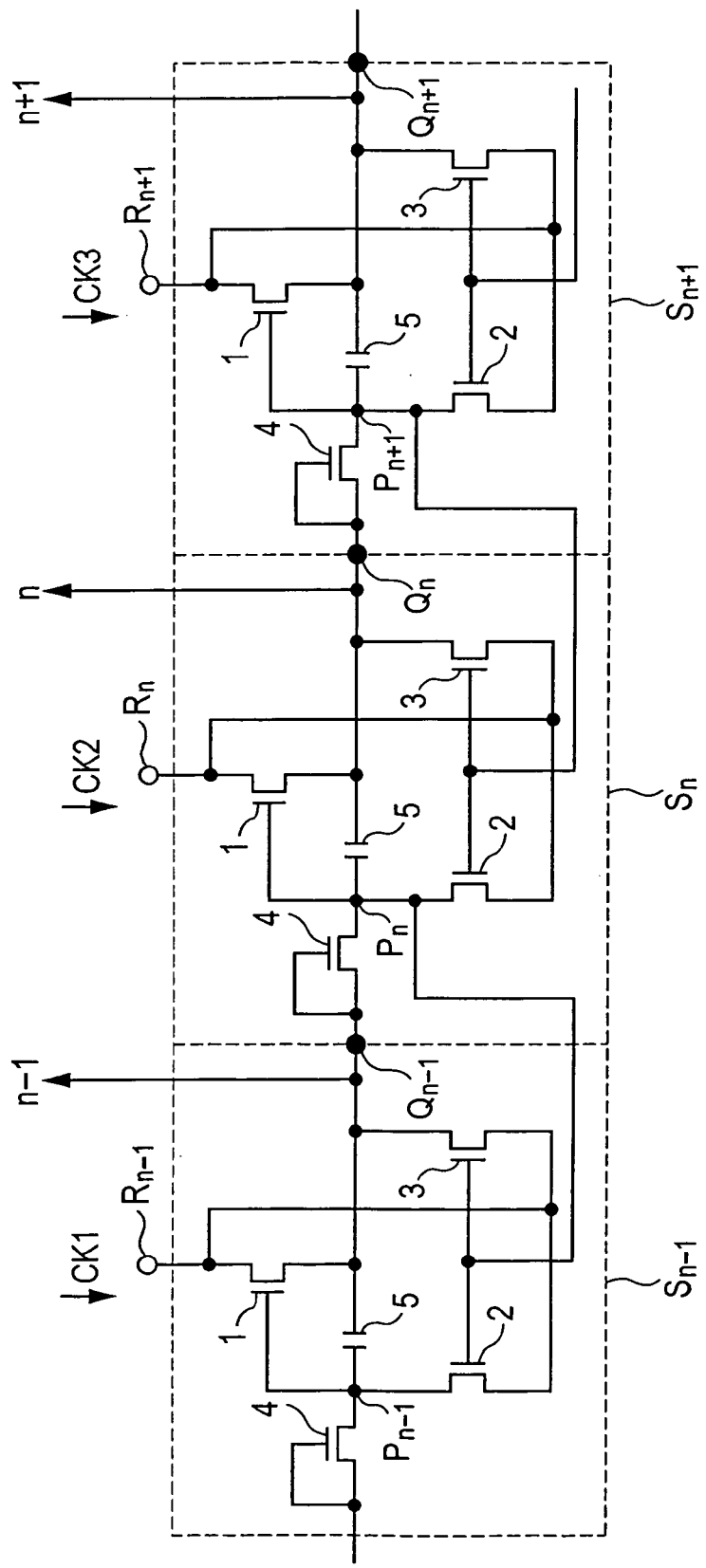
FIG. 5 is a circuit diagram of a shift register according to a third embodiment of the present invention.

FIG. 5 is a circuit diagram of a shift register according to a third embodiment of the present invention, showing three stages n−1, n, and n+1, of the shift register, by way of example.

The shift register according to the third embodiment is different from that according to the second embodiment in that the clamping transistor 2 and the pull-down transistor 3 are connected in parallel with respect to the clock terminal and the transistors 2 and 3 discharge the charge accumulated in the connection node and the output terminal to the clock terminal, respectively.

That is, when the clocks CK1, CK2, and CK3 are phase-shifted, the charge accumulated in the capacitor 5 in a given stage is discharged. When the capacitor 5 in the following stage is charged, a high-level output signal is output.

The shift register according to the third embodiment performs a similar operation to that according to the second embodiment described with reference to the timing chart shown in FIG. 4.

In the third embodiment, the charges accumulated in both terminals of the capacitor 5 are independently discharged to the clock terminal by the transistors 2 and 3.

According to the third embodiment, therefore, the charge accumulated in the capacitor 5 can be more rapidly discharged than the first and second embodiments, which is useful for high-speed shift register applications.

FIG. 4 is a timing chart showing the operation of the shift register according to the first, second, and third embodiments that is responsive to three-phase clock signals.

Also in the shift register that is responsive to three-phase clock signals, instead of two-phase clock signals, the period of time for which a high-level voltage is applied to the control electrode of the transistor 1 is two thirds of that in the related art, and deterioration of the transistor 1 can be suppressed over the related art.

The difference between three-phase signals and two-phase signals is that, at time t3, not the clock CK1 but a clock signal CK3 is supplied to the stage Sn+1, and the overall operations of the shift register in response to two-phase signals and three-phase signals are similar.

In the second and third embodiments, three-phase clock signals are not necessarily used. Alternatively, the duty ratio of two-phase clock signals may be adjusted so that a period of time for which the signals CK1 and CK2 are in the off state is produced. This reduces the number of lines without deterioration of the circuit operation.

The duty ratio of two-phase clock signals may be adjusted by shaping the waveform at the rise time and fall time of the clock signals and correcting for the nonuniformity of the waveform caused by delay, etc., so that the high levels of the clock signals do not overlap each other.

In the embodiment described above, each stage includes only one pull-down transistor 3. However, the shift register according to the present invention may include a plurality of pull-down transistors in each stage for controlling the output signal so as to be at the low level.

Figure 6:
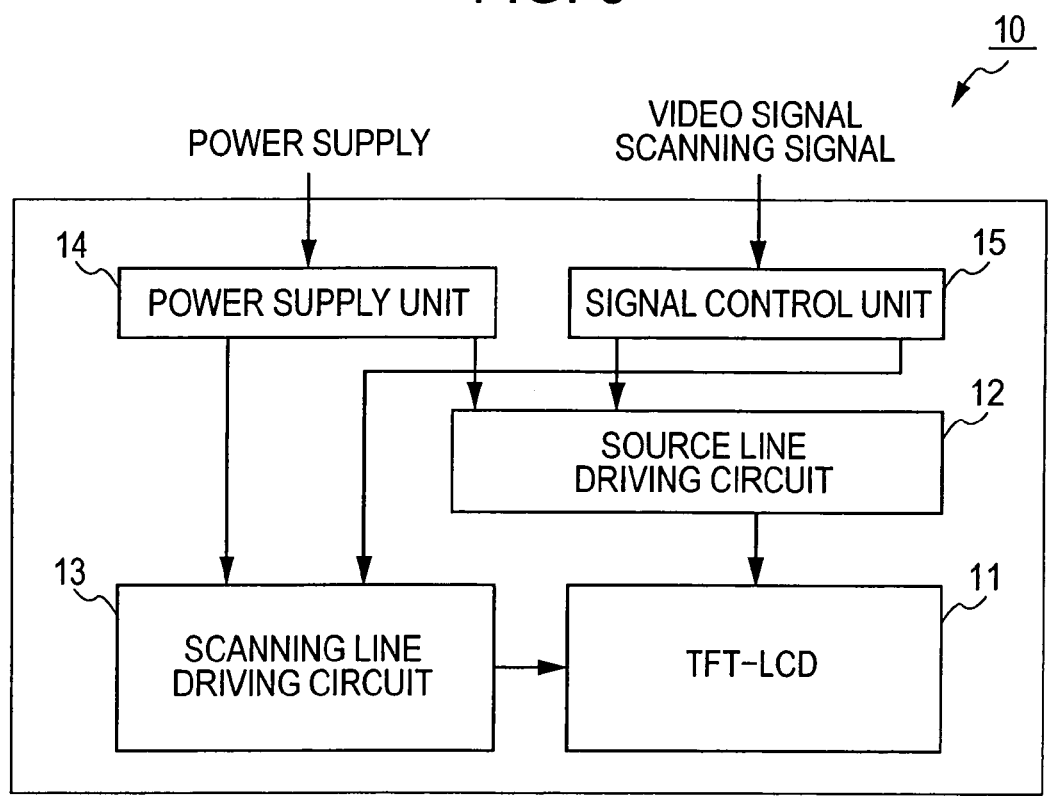
FIG. 6 is a block diagram of a liquid crystal display including the shift register according to the present invention serving as a scanning line driving circuit.

FIG. 6 is a block diagram of a liquid crystal display 10 including a shift register according to the present invention.

The liquid crystal display 10 includes a TFT-LCD unit 11 having an array of video signal lines (source lines) and scanning signal lines (gate lines) and thin-film transistors at intersections of the video signal lines and the scanning signal lines for driving liquid crystal of pixels, a source line driving circuit 12 for driving the source lines, a scanning line driving circuit (gate line driving circuit) 13 for driving the gate lines, a power supply unit 14 for supplying a power supply voltage, a video signal, and a scanning signal to the driving circuits 12 and 13, and a signal control unit 15.

An active-matrix circuit of the TFT-LCD unit 11 and the gate driving circuit 13 may be made of amorphous silicon or polycrystalline silicon. These components can be produced by the same manufacturing process, and the manufacturing process can therefore be simple.

The signal control unit 15 may control signals for the source line driving circuit 12 and may also function as a portion of the gate line driving circuit 13.

In the liquid crystal display 10 having the circuit structure described above, the gate line driving circuit 13 includes a shift register. For example, the gate scanning operation performed by the shift register in the gate line driving circuit 13 will be described.

Each of the gate lines is connected to a gate-line driving transistor, and the transistors are sequentially driven by the shift register in the gate line driving circuit 13 one-by-one in the order from the top to the bottom so as to be rendered into a conducting state for one scanning period. When the gate-line driving transistor connected to a given gate line is rendered into a conducting state in synchronization with a horizontal synchronization signal, all TFTs connected to this gate line are rendered into a conducting state. In this way, charge corresponding to the video signal on each source line is accumulated in a capacitor in each pixel electrode.

Figure 7:
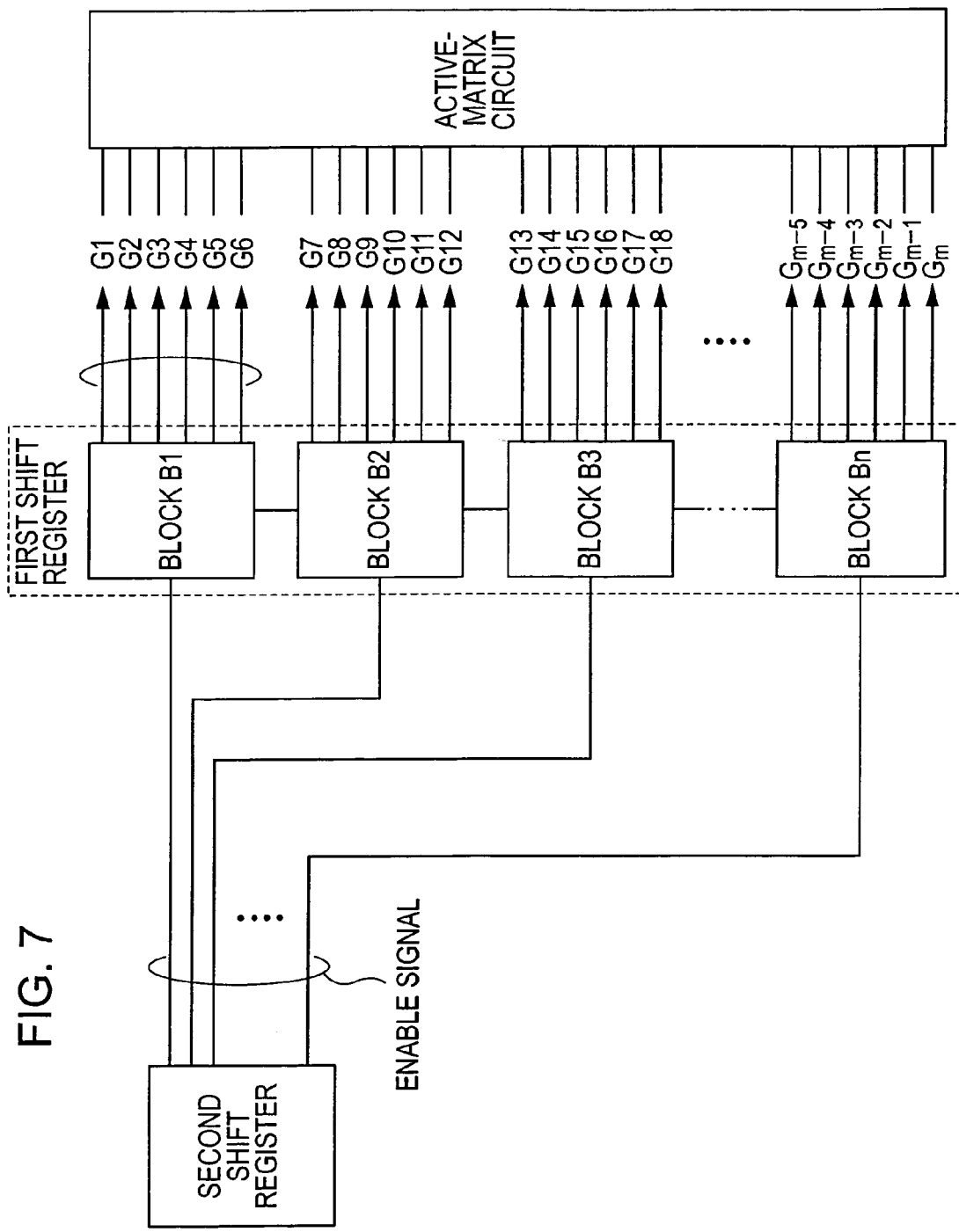
FIG. 7 is a block diagram of a shift register according to the present invention formed of first and second shift registers.
Figure 8:
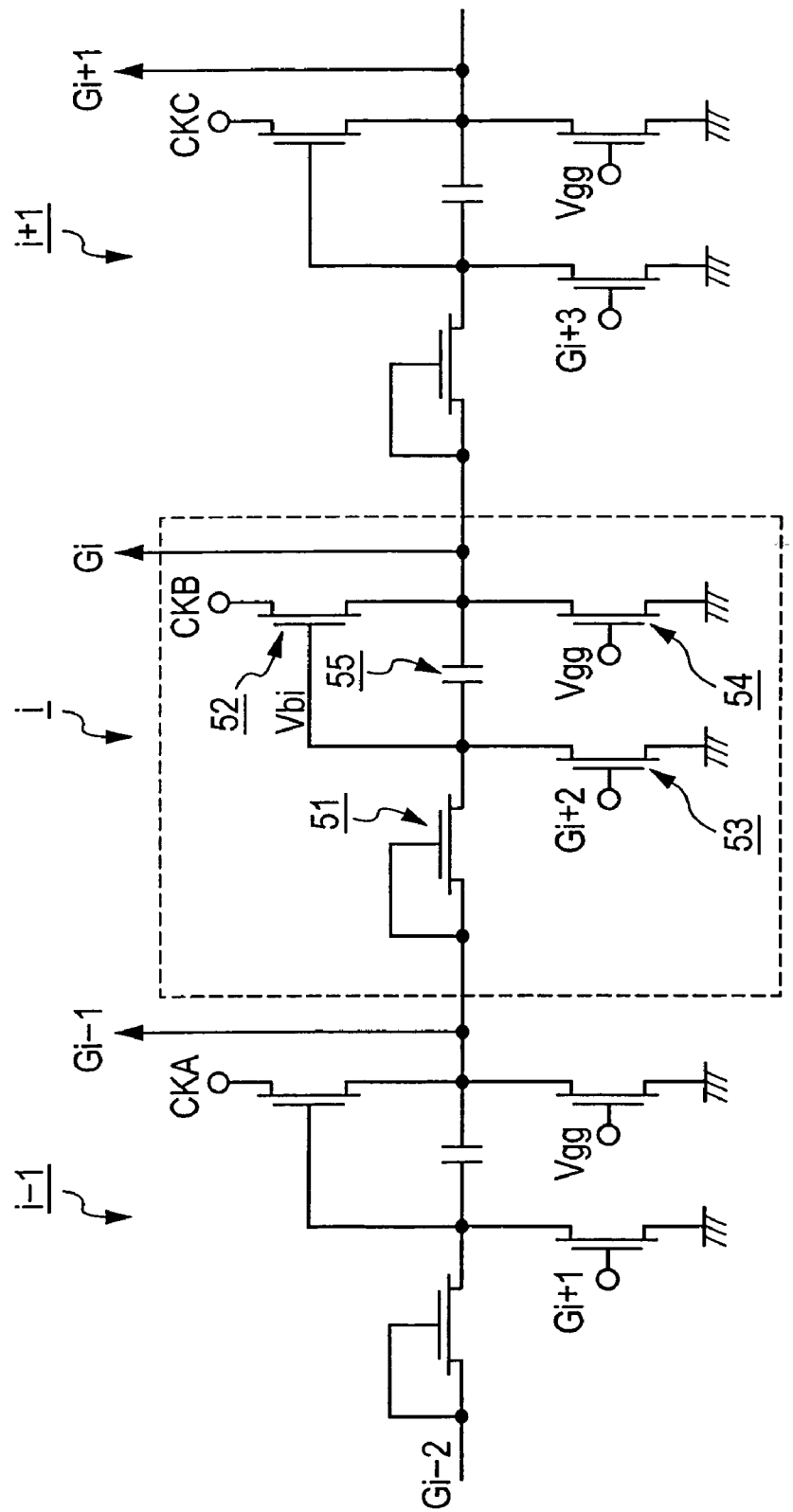
FIG. 8 is a circuit diagram of a shift register of the related art.

FIG. 7 shows a first shift register for actually outputting output signals (scanning drive signals), and a second shift register for controlling activation of the first shift register (i.e., power supply to the first shift register).

The first shift register is divided into a plurality of blocks, and the second shift register sequentially shifts enable signals to selectively activate (or enable) any of the divided blocks.

The first shift register is activated in units of blocks, and is paused for a period of time unnecessary to operate. Thus, the power consumption of the overall first shift register can be reduced, and the circuit deterioration caused by applying unnecessary pulses and by continuously applying power supply can also be prevented.

The first shift register is sequentially enabled by the second shift register, and therefore does not need to have an additional complex function for reducing the power supply. Thus, the power consumption can be reduced without increasing the circuit size, and the circuit deterioration can also be prevented.

Referring to FIG. 7, the first shift register is divided into n blocks B1 to Bn, and the second shift register supplies enable signals to the blocks B1 to Bn in a time-series manner so as to selectively activate a block to output an output signal. The selected block sequentially supplies output signals to associated scanning lines (G1 to Gm) to output scanning drive signals to an active-matrix circuit.

For example, when a start signal and a clock signal (such as two-phase clock signals) are to be sequentially output as scanning drive signals to the scanning lines G1 to G6, the second shift register outputs an enable signal to the block B1 of the first shift register.

After stages are shifted in the block B1, the second shift register outputs a clock signal to the block B2 as an enable signal.

The interval at which the second shift register shifts an enable signal is longer by multiples corresponding to the number of output terminals (that output the output signals) than the interval at which the first shift register shifts output signals. In FIG. 7, the block B1 has five output terminals for the scanning lines G1 to G5, and therefore the interval at which the second shift register shifts an enable signal is five times longer than the interval at which the first shift register shifts the output signals.

After output signals are shifted in a given block, the second shift register shifts an enable signal and supplies it to the following block.

The first shift register is made of the same material (or is produced by the same manufacturing process) as the active-matrix circuit (namely, TFTs), and the second shift register is formed of an integrated circuit (IC) chip formed on a silicon wafer or the like, unlike the active-matrix circuit. Since stress is placed on the TFTs only for a period of time for which an enable signal is output from the IC chip, the TFTs susceptible to stress can be prevented from experiencing operation failure over time.

What is claimed is:

1. A shift register having a plurality of stages connected in cascade, for shifting an output signal by a plurality of clock signals having different phases, each stage comprising:
    an input diode to which a signal is input from a preceding stage;
    a capacitor for holding charge having a voltage level of the signal input from the input diode;
    a first transistor that is turned on or off depending upon the voltage level held in the capacitor to output an output signal to a following stage in synchronization with a clock signal; and
    a second transistor connected between the input diode and an output terminal, a control electrode of the second transistor being connected to the input diode in the following stage, wherein the second transistor operates as a clamping transistor for discharging the charge accumulated in the capacitor and turning off the first transistor when the clock signal is phase-shifted.

2. The shift register according to claim 1, wherein each stage further comprises a third transistor connected between the output terminal from which the output signal is output and a clock terminal to which the clock signal is input, the third transistor operating as a pull-down transistor for pulling down the voltage of the terminal when the clock signal is phase-shifted, and
    when the clock signal is phase-shifted, the second transistor discharges the charge accumulated in the capacitor to the clock terminal via the third transistor.

3. The shift register according to claim 2, wherein the control electrode of the second transistor is connected to an output of the input diode in the following stage, and discharges the charge accumulated in the capacitor when the clock is phase-shifted.

4. A shift register that is configured such that the shift register according to claim 1 serves as a first shift register, and the first shift register is divided into a plurality of blocks and is activated block-by-block by a second shift register.

5. A liquid crystal driving circuit that is configured such that the first shift register according to claim 4 is made of the same material as that of thin-film transistors of an active-matrix circuit, and the second shift register is made of a material different from that of the thin-film transistors.

6. A liquid crystal driving circuit that is configured such that the shift register according to claim 1 is used to generate a scanning drive signal for an active-matrix circuit having scanning lines and signal lines intersecting each other.

7. A shift register having a plurality of stages connected in cascade, for shifting an output signal by a plurality of clock signals having different phases, each stage comprising:
    an input diode to which a signal is input from a preceding stage;
    a capacitor for holding charge having a voltage level of the signal input from the input diode;
    a first transistor that is turned on or off by the voltage level held in the capacitor to output an output signal to a follow in synchronization with a clock signal;
    a second transistor connected between the input diode and a clock terminal to which the clock signal is input; and
    a third transistor connected in parallel to the second transistor between an output terminal from which the output signal is output and the clock terminal, wherein the third transistor operates as a pull-down transistor for pulling down the voltage of the terminal to discharge the charge accumulated in the capacitor to the clock terminal when the clock signal is phase-shifted.

8. The shift register according to claim 7, wherein a control electrode of the second transistor is connected to an output of the input diode in the following stage, and discharges the charge accumulated in the capacitor when the clock is phase-shifted.

9. A shift register that is configured such that the shift register according to claim 7 serves as a first shift register, and the first shift register is divided into a plurality of blocks and is activated block-by-block by a second shift register.

10. A liquid crystal driving circuit that is configured such that the first shift register according to claim 9 is made of the same material as that of thin-film transistors of an active-matrix circuit, and the second shift register is made of a material different from that of the thin-film transistors.

11. A liquid crystal driving circuit that is configured such that the shift register according to claim 7 is used to generate a scanning drive signal for an active-matrix circuit having scanning lines and signal lines intersecting each other.

* * * * *